(12) United States Patent
Banerjee et al.

(10) Patent No.: US 7,564,290 B2
(45) Date of Patent: Jul. 21, 2009

(54) DESIGN STRUCTURE FOR A HIGH-SPEED LEVEL SHIFTER

(75) Inventors: Anirban Banerjee, Essex Junction, VT (US); Stephen F. Geissler, Underhill, VT (US); Shiu Chung Ho, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 11/869,146

(22) Filed: Oct. 9, 2007

(65) Prior Publication Data

US 2009/0091368 A1   Apr. 9, 2009

(51) Int. Cl.
*H03L 5/00* (2006.01)
(52) U.S. Cl. ............... 327/333; 327/208; 327/211; 326/68; 326/81
(58) Field of Classification Search ............... 327/333, 327/208, 211; 326/68, 81
See application file for complete search history.

(56) References Cited

U.S. PATENT DOCUMENTS

| | | | |
|---|---|---|---|
| 4,506,164 A * | 3/1985 | Higuchi | ............ 326/81 |
| 5,644,265 A | 7/1997 | Austin et al. | |
| 5,892,385 A * | 4/1999 | Hashiguchi | ............ 327/333 |
| 6,191,616 B1 | 2/2001 | Merritt et al. | |
| 6,307,398 B2 | 10/2001 | Merritt et al. | |
| 2001/0000654 A1 | 5/2001 | Merritt et al. | |
| 2002/0145461 A1 * | 10/2002 | Horan et al. | ............ 327/333 |
| 2003/0173995 A1 | 9/2003 | Cairns et al. | |
| 2006/0214718 A1 | 9/2006 | Chen | |
| 2007/0008003 A1 | 1/2007 | Boerstler et al. | |
| 2007/0063734 A1 | 3/2007 | Huang | |

\* cited by examiner

*Primary Examiner*—Kenneth B Wells
*Assistant Examiner*—John W Poos
(74) *Attorney, Agent, or Firm*—Gibb I.P. Law Firm, LLC; Riyon Harding, Esq.

(57) ABSTRACT

Disclosed are embodiments of a design structure for a voltage level shifter circuit that operates without forward biasing junction diodes, regardless of the sequence in which different power supplies are powered up. The circuit embodiments incorporate a pair of series connected switches (e.g., transistors) between an input terminal and a voltage adjusting circuit. Each switch is controlled by a different supply voltage from a different power supply. Only when both power supplies are powered-up and the different supply voltages are received at both switches will a first signal generated using one of the supply voltages be passed to a voltage adjusting circuit and thereafter converted into a second signal representative of the first signal, but generated using the second supply voltage. Incorporation of the pair of series connected switches into the voltage level shifter circuit prevents forward biasing of junction diodes in the circuit and thereby prevents current leakage from the power supplies.

17 Claims, 11 Drawing Sheets

US 7,564,290 B2

DESIGN STRUCTURE FOR A HIGH-SPEED LEVEL SHIFTER

BACKGROUND

1. Field of the Invention

The embodiments of the invention generally relate to voltage level shifters and, more particularly, to a design structure for high-speed voltage level shifter circuit with no power-on sequencing requirement as well as a design structure on which the circuit resides.

2. Description of the Related Art

Voltage level shifter circuits are widely used in analog and mixed signal designs having multiple voltage domains. Such voltage level shifter circuits convert signals from one voltage level domain to another. For example, a voltage level shifter circuit can be designed to convert a signal from a device operating under a first power supply, which provides a first supply voltage VDD1, so that it can be processed by another device operating under a second power supply, which provides a different supply voltage VDD2. However, due to asynchronous power-up sequences, high speed voltage level shifter circuits have a tendency to suffer from large amounts of leakage current from the supply rails.

SUMMARY

In view of the foregoing, disclosed herein are embodiments of a design structure for a high speed voltage level shifter circuit capable of operating without the formation of any forward biased PN-junction diodes, regardless of the sequence in which different power supplies are powered up. Specifically, the circuit embodiments incorporate a pair of series connected switches (e.g., series connected pass gate transistors) between the input terminal and a voltage adjusting circuit. Each switch is controlled by a different supply voltage from a different power supply. Thus, only when both power supplies are powered-up and the different supply voltages are received at both switches will a first signal (generated using one of the supply voltages) be passed to a voltage adjusting circuit and, thereafter, converted into a second signal, which is representative of the first signal, but generated using the second supply voltage VDD2. Incorporation of the pair of series connected switches into the voltage level shifter circuit prevents forward biasing of PN-junction diodes in the circuit and thereby prevents current leakage from the power supplies.

More particularly, embodiments of the voltage level shifter circuit of the present invention can comprise two separate power supplies: a first power supply adapted to provide a first supply voltage VDD1 and a second power supply adapted to provide a second supply voltage VDD2 different from the first supply voltage VDD1. The voltage level shifter circuit can further comprise an input terminal adapted to receive a first signal generated using the same first supply voltage VDD1 (i.e., in the same first voltage domain). The voltage level shifter circuit can further comprise an output terminal adapted to output a second signal representative of the first signal and generated using the second supply voltage VDD2. This second signal can then be processed by another device operating under the same second supply voltage VDD2 (i.e., in the same second voltage domain). In order to convert the first signal to the second signal, a voltage adjusting circuit and a buffer circuit can be connected between the input terminal and the output terminal.

A unique aspect of the voltage level circuit embodiments is a pair of series connected switches (e.g., a pair of series connected pass gate transistors, such as N-type field effect transistors (NFETs)) connected between the input terminal and the voltage adjusting circuit. Specifically, this pair of series connected switches comprises a first switch controlled by the first power supply and a second switch controlled by the second power supply such that only when the first supply voltage VDD1 from the first power supply reaches the first switch and the second supply voltage VDD2 from the second power supply reaches the second switch will the first signal pass to the voltage adjusting circuit. For example, if the switches comprise pass gate transistors, the pair of series connected pass gate transistors can comprise a first pass gate transistor with a first gate controlled by the first power supply and a second pass gate transistor with a second gate controlled by the second power supply such that only when the first supply voltage VDD1 from the first power supply reaches the first gate and the second supply voltage VDD2 from the second power supply reaches the second gate will the first signal pass through the first pass gate transistor and the second pass gate transistor to the voltage adjusting circuit.

During asynchronous powering-up of the first power supply and the second power supply, the pair of series connected switches (e.g., the pair of series connected pass gate transistors) prevents forward biased PN-junction diode formation in the voltage adjusting circuit and, thereby, minimizes leakage current from power supplyies. For example, the voltage level shifter circuit can comprise a first intermediate node adapted to connect the input terminal via the pair of series connected switches to the voltage adjusting circuit. The voltage adjusting circuit can comprise a conventional voltage adjusting circuit with plurality of interconnected field effect transistors. More particularly, the voltage adjusting circuit can comprise at least one P-type field effect transistor (PFET) having a first P-type region (e.g., a P+ diffusion drain region) and a second P-type region (e.g., a P+ diffusion source region). The first and second P-type regions can be adjacent an N-type region (e.g., within an NWELL in a P− substrate). The first P-type region can be coupled to the first power supply via the first intermediate node, the second P-type region can be coupled to the second power supply via a second intermediate node and the N-type region can be coupled to ground potential.

Consequently, if this PFET is not turned ON (i.e., by the second power supply) at the same time or before the first supply voltage VDD1 reaches the first intermediate node, then the first P-type region will sit at the first supply voltage VDD1 and the N-type region will sit at the ground potential (i.e., a forward biased PN-junction diode is formed). However, the pair of series connected switches (e.g., the pair of series connected pass gate transistors) is adapted to prevent this state from occurring and, thereby, to prevent forward biasing of any PN-junction diodes in the circuit, when the different supply voltages are received by the circuit from the different power supplies at different times. As mentioned above, only when the first supply voltage VDD1 from the first power supply reaches the first switch and the second supply voltage VDD2 from the second power supply reaches the second switch will the first signal pass to the first intermediate node and, thereby, to the voltage adjusting circuit. This ensures that the PFET will already have been turned ON by the second supply voltage VDD2, when the first signal at VDD1 reaches its drain region. Thus, the PN-junction diode will not be forward biased.

At this point, the voltage adjusting circuit is adapted to pull the first signal at the first intermediate node from the first supply voltage VDD1 to the second supply voltage VDD2. The buffer circuit can also be connected to the pair of series connected switches at the first intermediate node. This buffer circuit can be adapted to generate, from the first signal at the intermediate node, the second signal and to pass that second signal to the output terminal. Again, the second signal is representative of the first signal, but generated using the second supply voltage VDD2 so that it can be processed by a second device operating in the second voltage domain.

One particular embodiment of such a voltage level shifter circuit is composed of two separate sections (i.e., a first section and a second section) with the pair of series connected switches incorporated into the second section. This embodiment can further comprise a first power supply adapted to provide a first supply voltage VDD1 to the first section and a second power supply adapted to provide a second supply voltage VDD2, different from the first supply voltage VDD1, to the second section.

The first section can comprise an input terminal, two output terminals, and a buffer circuit. Specifically, the first section-input terminal can be adapted to receive a first signal. This first signal can be generated by a first device using the same first supply voltage VDD1. The first section-first output terminal can be adapted to output the first supply voltage VDD1. The first section-buffer circuit can be connected to the first section-input terminal and can be adapted to buffer the first signal, creating a buffered first signal representative of the first signal. The first section-second output terminal can be connected to the first section-buffer circuit and can be adapted to output the buffered first signal.

The second section can comprise two input terminals, a pair of series connected pass gate transistors, an output terminal, a voltage adjusting circuit and a buffer circuit. Specifically, the second section-first input terminal can be adapted to receive the first supply voltage VDD1 from the first section-first output terminal. The second section-second input terminal can be adapted to receive the buffered first signal from the first section-second output terminal. The second section-output terminal can be adapted to output a second signal that is representative of the first signal, but that is generated using the second supply voltage VDD2. Thus, the second signal can be processed by another device operating under the same second supply voltage VDD2 (i.e., in the same second voltage domain).

A unique aspect of this voltage level circuit embodiment is the pair of series connected pass gate transistors (e.g., series connected N-type field effect transistors (NFETs)) within the second section connected between the two input terminals and the voltage adjusting circuit. The first pass gate transistor can comprise a first gate, a first source and a first drain. In this first pass gate transistor, the first gate can be controlled by the first supply voltage VDD1 at the second section-first input terminal and the first source can be connected to the second section-second input terminal. The second pass gate transistor connected in series with the first pass gate transistor. Specifically, the second pass gate transistor can comprise a second gate, a second source and a second drain. In the second pass gate transistor, the second gate can be controlled by the second supply voltage VDD2 from the second power supply and the second source can be connected to the first drain of the first pass gate transistor. Thus, only when the first supply voltage VDD1 reaches the first gate of the first pass gate transistor and the second supply voltage VDD2 reaches the second gate of the second pass gate transistor will the buffered first signal pass through both the first pass gate transistor and the second pass gate transistor into the second drain of the second pass gate transistor.

During asynchronous powering-up of the first power supply and the second power supply, the pair of series connected pass gate transistors prevents forward biased PN-junction diode formation in the voltage adjusting circuit so as to minimize leakage current from the first power supply and the second power supply. For example, the voltage level shifter circuit can comprise a first intermediate node adapted to connect the second section-input terminal via the pair of series connected pass gate transistors to the voltage adjusting circuit. The voltage adjusting circuit can comprise a conventional voltage adjusting circuit with plurality of interconnected field effect transistors. More particularly, the voltage adjusting circuit can comprise at least one P-type field effect transistor (PFET) having a first P-type region (e.g., a P+ diffusion drain region) and a second P-type region (e.g., a P+ diffusion source region). The first and second P-type regions can be adjacent an N-type region (e.g., within an NWELL in a P− substrate). The first P-type region can be coupled to the first power supply via the first intermediate node, the second P-type region can be coupled to the second power supply via a second intermediate node and the N-type region can be coupled to ground potential.

Consequently, if the PFET is not turned ON (i.e., by the second power supply) at the same time or before the first supply voltage VDD1 reaches the first intermediate node, then the first P-type region will sit at the first supply voltage VDD1 and the N-type region will sit at the ground potential and thereby form a forward biased PN-junction diode. However, the pair of series connected switches pass gate transistors is adapted to prevent this state from occurring and thereby to prevent forward biased PN-junction diode formation, when the voltage level shifter circuit receives the first supply voltage VDD1 from the first power supply and the second supply voltage VDD2 from the second power supply at different times. As mentioned above, only when the first supply voltage VDD1 from the first power supply reaches the first gate and the second supply voltage VDD2 from the second power supply reaches the second gate will the buffered first signal pass to the first intermediate node and, thereby, to the voltage adjusting circuit. This ensures that the PFET will already have been turned ON by the second supply voltage VDD2, when the first signal at VDD1 reaches its drain region. Thus, the PN-junction diode will not be forward biased.

At this point the voltage adjusting circuit is adapted to pull the buffered first signal at the first intermediate node from the first supply voltage VDD1 to the second supply voltage VDD2. The second section-buffer circuit can also be connected to the pair of series connected pass gate transistors at the first intermediate node. This buffer circuit can be adapted to generate, from the buffered first signal at the intermediate node, the second signal and to pass that second signal to the second section-output terminal. Again, the second signal is representative of the first signal, but generated using the second supply voltage VDD2 so that it can be processed by a second device operating in the second voltage domain.

Also disclosed herein are embodiments of a design structure embodied in a machine readable medium used in a design flow process for designing the above-described circuit embodiments. This design structure can comprise a netlist which describes the circuit as well as test data files, characterization data, verification data or design specifications. Additionally, this design structure can reside on a GDS storage medium.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
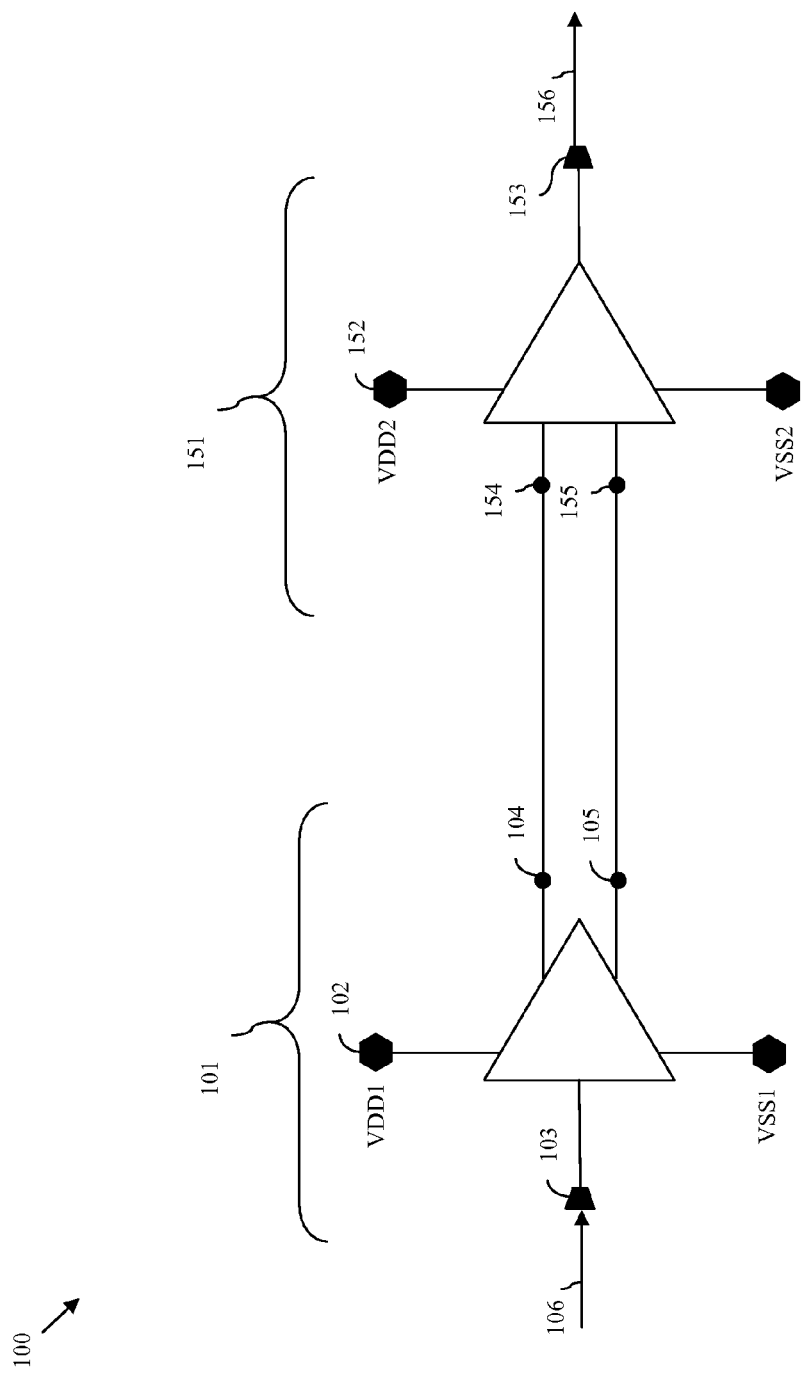
FIG. 1 is a schematic diagram illustrating a high speed voltage level shifter circuit.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Disclosed herein are embodiments of a design structure for a high speed voltage level shifter circuit capable of translating voltage levels amongst multiple voltage domains without the formation of any forward biased PN-junction diodes, regardless of the sequence in which different power supplies are powered up (i.e., regardless of the sequence in which different supply voltages are received by the circuit). Specifically, the circuit embodiments incorporate a pair of series connected switches (e.g., series connected pass gate transistors) between an input terminal and a voltage adjusting circuit. Each switch is controlled by a different supply voltage from a different power supply. Thus, only when both power supplies are powered-up and the different supply voltages are received at both switches will a first signal generated using one of the supply voltages be passed to a voltage adjusting circuit and, thereafter, converted into a second signal, which is representative of the first signal, but generated using the second supply voltage VDD2. Incorporation of the pair of series connected switches into the voltage level shifter circuit prevents forward biasing of PN-junction diodes in the circuit and, thereby, prevents current leakage from the power supplies.

As mentioned above, voltage level shifter circuits are widely used in analog and mixed signal designs having multiple voltage domains. Such voltage level shifter circuits convert signals from one voltage level domain to another. For example, a voltage level shifter can be designed to convert a signal from a device operating under a first power supply, which provides a first supply voltage VDD1, so that it can be processed by another device operating under a second power supply, which provides a different supply voltage VDD2. However, high speed voltage level shifter circuits have a tendency to suffer from large amounts of leakage current from the supply rails. Specifically, asynchronous power-up sequencing in high speed voltage level shifter circuits can result in the formation of a forward biased PN junction diode. Forward biasing a PN-junction diode within the voltage level shifter circuit can cause significant leakage current from one of the power supply domains and, thereby, can cause a slow down in voltage level shifter circuit performance For example, FIG. 1 is a top level schematic diagram of an exemplary voltage level shifter circuit 100 that is capable of operating in the GHz (e.g., ~2 GHz) range, but that is subject to forward biased PN-junction diode formation due to asynchronous power-up sequencing. This voltage level shifter circuit 100 can comprise a first section 101 and a second section 151 connected to the first section 151.

The first section 101 is connected to a first power supply 102 in order to receive a first supply voltage VDD1. Thus, the first section 101 operates in a first voltage domain. The first section 101 can comprise an input terminal 103 adapted to receive a first signal 106 from a first device (not shown) operating in the same first voltage domain. That is, this first signal 106 was generated using the same first supply voltage VDD1. The first section 101 also comprises two output terminals 104 and 105.

The second section 151 is connected to a second power supply 152 adapted to receive a second supply voltage VDD2 that is different from the first supply voltage VDD1. Thus, the second section 151 operates in a second voltage domain. The second section 151 comprises two input terminals 154-155 directly coupled to the two output terminals 104-105 of the first section 101, respectively. The second section 151 also comprises an output terminal 153 adapted to output a second signal 156 (i.e., a converted signal) to a second device (not shown) operating in the same second voltage domain. That is, the second signal 156 is representative of the first signal 106, but is generated using the second supply voltage VDD2 so that it can be processed by a second device that also operates using the same second supply voltage VDD2.

Figure 2:
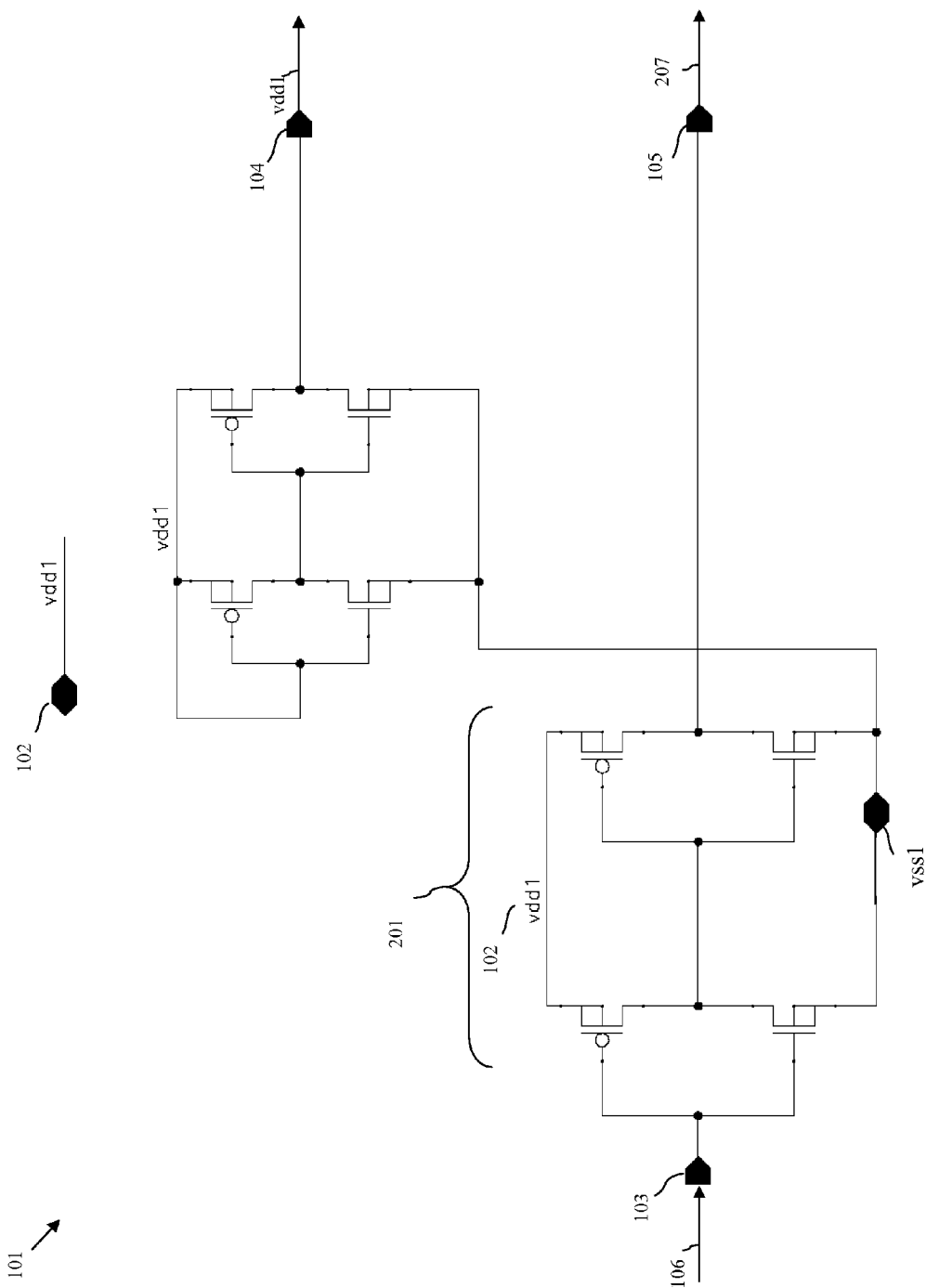
FIG. 2 is a schematic diagram illustrating a first section of the circuit of FIG. 1.

FIG. 2 is a detailed schematic diagram of the first section 101 of the voltage level shifter circuit 100 of FIG. 1. As discussed above, the first section 101 is connected to a first power supply 102 adapted to receive a first supply voltage VDD1. The first section 101 comprises an input terminal 103 and two output terminals 104-105. Again, the input terminal 103 of the first section 101 is adapted to receive a first signal 106 from a first device (not shown) that operates in the same first voltage domain. The first signal 106 is driven through a buffer circuit 201 to the output terminal 105, which outputs a buffered first signal 207. The output terminal 104, however, is always maintained at logic high and, thus, generates the full rail voltage VDD1 from the first power supply 102.

Figure 3:
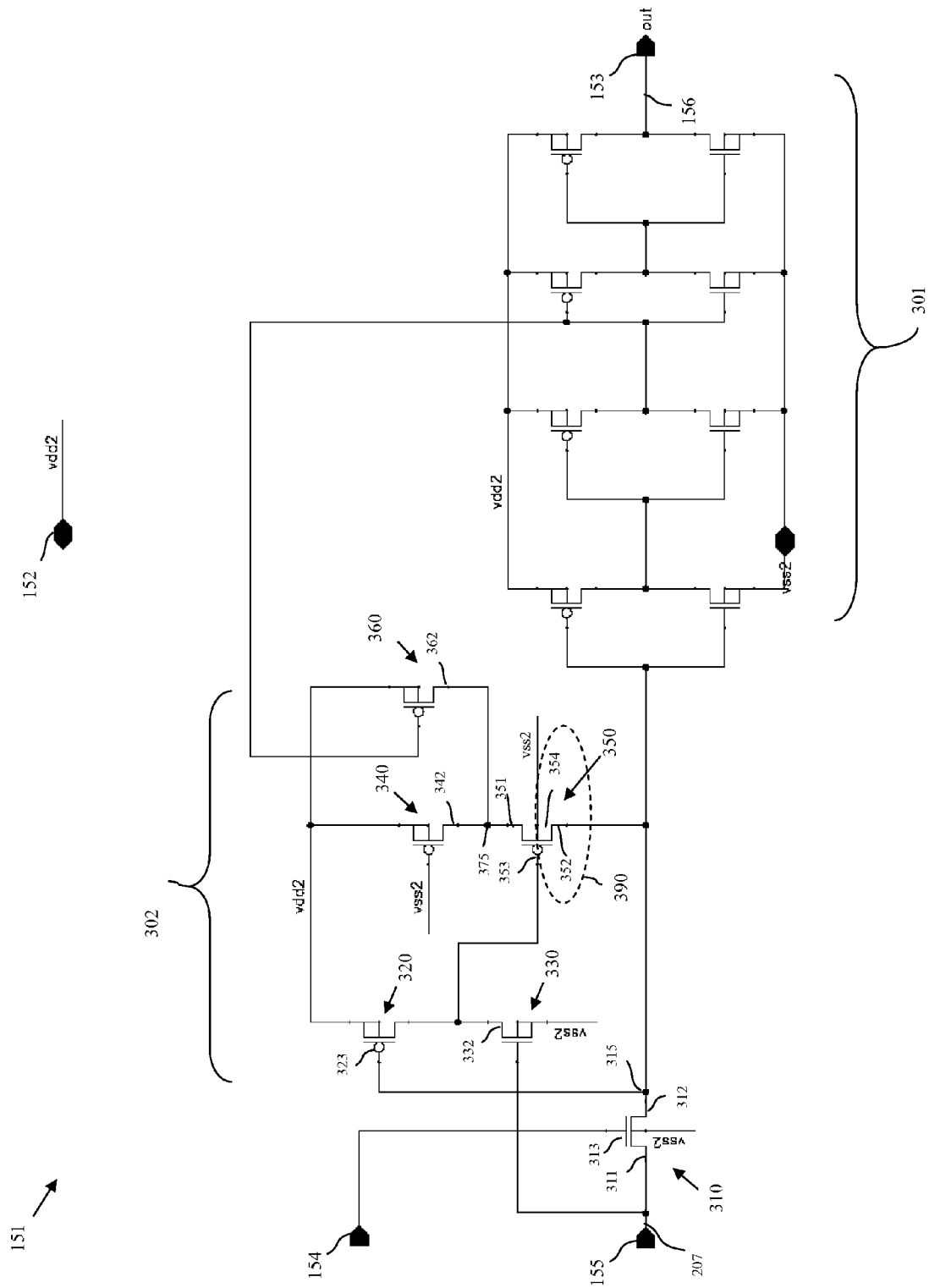
FIG. 3 is a schematic diagram illustrating a second section of the circuit of FIG. 1.

FIG. 3 is a detailed schematic diagram of the second section 151 of the voltage level shifter circuit 100 of FIG. 1. As discussed above, the second section 151 is connected to a second power supply 152 adapted to receive a second supply voltage VDD2 that is different from the first supply voltage VDD1. The second section 151 comprises two input terminals 154-155. The input terminal 155 of the second section 151 is directly coupled to the first output terminal 105 of the first section 101. Thus, the input terminal 155 receives the buffered signal 207 from the output terminal 105 of the first section 101. The input terminal 154 of the second section 151 is directly coupled to the output signal 104 of the first section 101. Thus, the second input terminal 154 receives the full rail voltage VDD1 from the first power supply 102 output at the first output terminal 104.

The second section 151 further comprises a pass gate transistor 310 (e.g., an N-channel metal oxide semiconductor field effect transistor (NFET)). The source region 311 of the pass gate transistor 310 is coupled to the input terminal 155 in order to receive the buffered signal 207 from first section 101. The gate 313 of the pass gate transistor 310 is coupled to the second input terminal 154 such that it is controlled by the first supply voltage VDD1 from the first power supply 102. The drain region 312 of the pass gate transistor 310 is coupled to an intermediate node 315.

This intermediate node 315 is further be coupled to the input of a multi-stage (e.g., four-stage) buffer system 301 and to a voltage adjusting circuit 302 (e.g., a voltage pull-up circuit) biased by the second supply voltage VDD2. The buffer system 301 is adapted to generate a second signal 156 (i.e., a converted signal) and output that second signal 156 at the second output terminal 153. Again, this second signal 156 is representative of the first signal 106, but is generated using the second supply voltage VDD2 so that it can be processed by a second device (not shown) that also operates using the same second supply voltage VDD2 (i.e., by a second that operates in the same second voltage domain).

The voltage adjusting circuit 302 is adapted to pull the intermediate node 315 from the first supply voltage VDD1 of the first power supply 102 to the second voltage VDD2 of the second power supply 152. This voltage adjusting circuit 302 compries a plurality of interconnected N-type and P-type field effect transistors (e.g., PFET 320, NFET 330, PFET 340, PFET 350 and PFET 360). Specifically, the intermediate node 315 is coupled to the gate 323 of a PFET 320 and to the drain region 352 of PFET 350. The gate 353 of the PFET 350 is coupled to the drain region 332 of an NFET 330. The source region 351 of the PFET 350 is coupled to another node 375, which in turn is coupled to the drain regions 342 and 362 of the PFETS 340 and 360, respectively.

In the second section 151 of the voltage level shifter circuit 100, the single pass gate transistor 310 is constantly biased by the first supply voltage VDD1 at its gate 313. Specifically, since the first output terminal 104 of the first section 101 is always at logic high, so is the second input terminal 154 of the second section 151. Since the second input terminal 154 is always at logic high, the gate 313 is similarly always at logic high. As a result, the pass gate transistor 310 is always ON and, thereby, always transferring the input 107 from the first section 101 to intermediate node 315. However, because the pass gate transistor 310 is always ON, a forward biased PN-junction diode can be formed within the voltage adjusting circuit 302 at the PFET 350. Formation of the forward biased PN-junction diode is specifically due to asynchronous power-up sequencing of the first and second voltage domains (i.e., due to the different arrival times at the circuit 100 of first and second supply voltages VDD1 and VDD2). Such a forward biased PN-junction diode can draw a significant amount of current from a supply rail and, thereby, can result in a slow down of the voltage level shifter circuit 100 performance.

Figure 4:
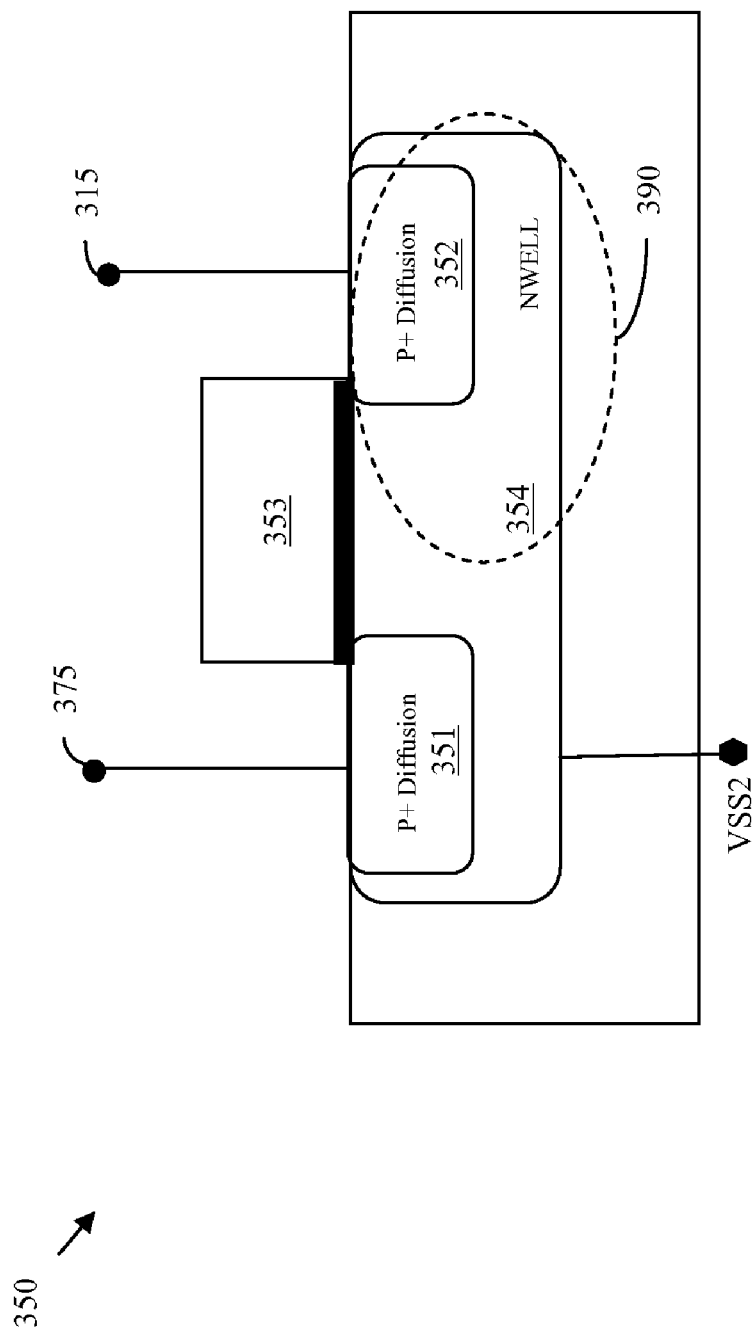
FIG. 4 is a diagram illustrating an exemplary PFET incorporated into a voltage adjusting circuit in the second section of FIG. 3.

For example, a forward biased PN-junction diode 390 can be formed in PFET 350 of the voltage adjusting circuit 302 of a voltage level shifter 100, as follows. FIG. 4 is an exemplary diagram of the PFET 350 in which the source and drain regions 351-352 comprise P-type regions, such as P+ diffusion regions. The P-type regions are doped with a P-type dopant (e.g., boron (B)). The source and drain regions 351-352 are further formed adjacent to an N-type region 354, such as in an NWELL in a P– substrate. The N-type region is doped with an N-type dopant (e.g., phosphorus (P), antimony (Sb) or arsenic (As)).

Referring to FIG. 4 in combination with FIG. 3, consider a power-up sequencing scenario where the first supply voltage VDD1 from the first power supply 102 arrives at the voltage level shifter circuit 100 before the second supply voltage VDD2 from the second power supply 152. As discussed above, the intermediate node 315 is coupled to the drain region 352 of the PFET 350. The source region 351 of the PFET 350 is coupled to another intermediate node 375. Intermediate node 375 is coupled to the drain regions 342 and 362 of PFETs 340 and 360, which operate under the second voltage domain VDD2. Thus, PFET 350 will not be turned ON until the second supply voltage VDD2 from the second power supply 152 reaches the voltage level shifter circuit 100 and, more specifically, reaches source region 351 via the intermediate node 375.

However, since the pass gate NFET 310 is always ON, the intermediate node 315 will receive the buffered first signal 207 from the first section 101 once the first supply voltage VDD1 reaches the gate 313 of pass gate NFET transistor 310. If this occurs, the P-type drain region 352 of PFET 350 will sit at the first supply voltage VDD1. Furthermore, the N-type region 354 that is adjacent to the drain region 352 will sit at ground potential VSS2. Thus, a forward biased PN-junction diode 390 is formed. That is, when the anode (i.e., the P+ diffusion drain region 352) is biased at VDD1 via the buffered first signal 207 output at the drain region 312 of the pass gate transistor 310 and when the cathode (i.e., the N-Well 354) is biased at ground potential VSS2 because VDD2 is not yet powered up, then the PN-junction diode 390 is completely forward biased. Forward biasing the PN-junction diode 390 in the high speed level shifter circuit 100 draws significant amounts of current from the first power supply 102. This current leakage will, in turn, cause power dissipation and eventual performance degradation in the high speed voltage level shifter circuit 100.

In view of the foregoing, disclosed here are embodiments of a high speed voltage level shifter circuit capable of operating without the formation of any forward biased PN-junction diodes, regardless of the sequence in which different power supplies are powered up (i.e., regardless of the sequence in which different supply voltages are received by the circuit). Specifically, the circuit embodiments incorporate a pair of series connected switches (e.g., series connected pass gate transistors) between an input terminal and a voltage adjusting circuit. Each switch is controlled by a different supply voltage from a different power supply. Thus, only when both power supplies are powered-up and the different supply voltages are received at both switches will a first signal generated using one of the supply voltages be passed to a voltage adjusting circuit and, thereafter, converted into a second signal, which is representative of the first signal, but generated using the second supply voltage VDD2. Incorporation of the pair of series connected switches into the voltage level shifter circuit prevents forward biasing of PN-junction diodes in the circuit and thereby prevents current leakage from the power supplies.

Figure 5:
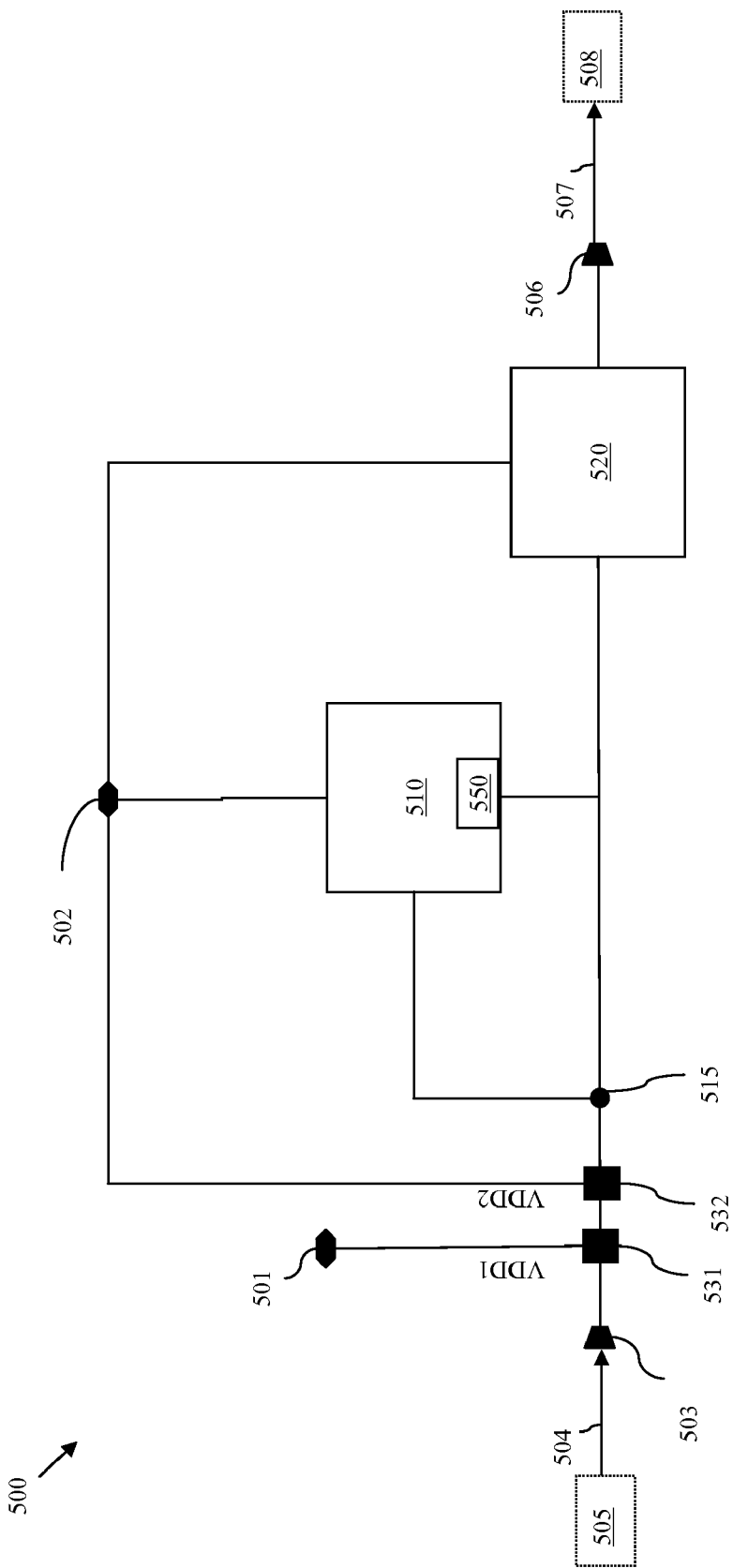
FIG. 5 is a schematic diagram illustrating an embodiment of a voltage level shifter circuit according to the present invention.

More particularly, referring to FIG. 5, one embodiment of a voltage level shifter circuit 500 can comprise two separate power supplies: a first power supply 501 adapted to provide a first supply voltage VDD1 to the circuit 500 and a second power supply 502 adapted to provide a second supply voltage VDD2 different from the first supply voltage VDD1 to the circuit 500. The voltage level shifter circuit 500 can further comprise an input terminal 503 adapted to receive a first signal 504 generated using the same first supply voltage VDD1. For example, the first signal 504 can be generated by a device 505 operating under the same first supply voltage VDD1 (i.e., in the same first voltage domain). The voltage level shifter circuit 500 can further comprise an output terminal 506 adapted to output a second signal 507 representative of the first signal 504 and generated using the second supply voltage VDD2. This second signal 507 can then be processed by another device 508 operating under the same second supply voltage VDD2 (i.e., in the same second voltage domain). In order to convert the first signal 504 to the second signal 507, a voltage adjusting circuit 510 and a buffer circuit 520 can be connected between the input terminal 503 and the output terminal 506.

One unique aspect of this voltage level circuit 500 is a pair of series connected switches 531-532 (e.g., series connected pass gate transistors, such as N-type field effect transistors (NFETs)) connected between the input terminal 503 and the voltage adjusting circuit 510. Specifically, this pair of series connected switches 531-532 comprises a first switch 531 controlled by the first power supply 501 and a second switch 532 controlled by the second power supply 502 such that only when the first supply voltage VDD1 from the first power supply 501 reaches the first switch 531 and the second supply voltage VDD2 from the second power supply 502 reaches the second switch 532 will the first signal 504 pass to the voltage adjusting circuit 510. For example, if the switches 531-532 comprise pass gate transistors, the pair of pass gate transistors can comprise a first pass gate transistor 531 with a first gate controlled by the first power supply 501 and a second pass gate transistor 532 with a second gate controlled by the second power supply 502 such that only when the first supply voltage VDD1 from the first power supply 501 reaches the first gate and the second supply voltage VDD2 from the second power supply 502 reaches the second gate will the first signal 504 pass through the first pass gate transistor 531 and the second pass gate transistor 532 to the voltage adjusting circuit 510.

Figure 6:
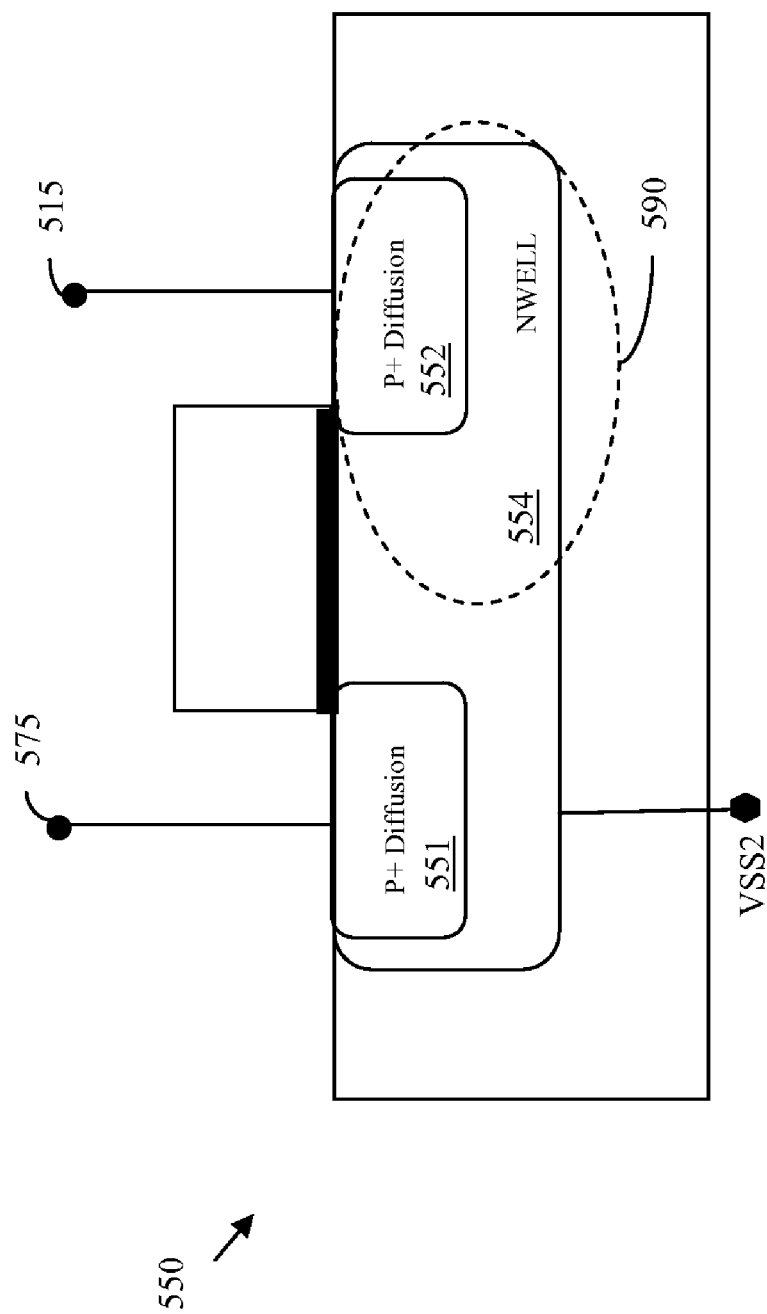
FIG. 6 is a schematic diagram illustrating an exemplary PFET incorporated into a voltage adjusting circuit in the circuit of FIG. 5.

During asynchronous powering-up of the first power supply 501 and the second power supply 502, the pair of series connected switches 531-532 (e.g., the pair of series connected pass gate transistors) prevents forward biased PN-junction diode formation in the voltage adjusting circuit 510 so as to minimize leakage current from the first power supply 501 and the second power supply 502. For example, the voltage level shifter circuit 510 can comprise a first intermediate node 515 adapted to connect the input terminal 503 via the pair of series connected switches 531-532 (e.g., via a pair of series connected pass gate transistors) to the voltage adjusting circuit 510. The voltage adjusting circuit 510 can comprise a conventional voltage adjusting circuit with a plurality of interconnected field effect transistors. More particularly, the voltage adjusting circuit can comprise at least one P-type field effect transistor (PFET) 550. Referring to FIG. 6 in combination with FIG. 5, this PFET 550 can comprise a first P-type region 552 (e.g., a P+ diffusion drain region) and a second P-type region 551 (e.g., a P+ diffusion source region). The first and second P-type regions 551-552 can be adjacent an N-type region 554 (e.g., within an NWELL in a P– substrate). The first P-type region 552 can be coupled to the first power supply 501 via the first intermediate node 515, the second P-type region can be coupled to the second power supply 502 via a second intermediate node 515 and the N-type region 554 can be coupled to ground potential VSS2.

Consequently, if the PFET 550 is not turned ON (i.e., by the second power supply) at the same time or before the first supply voltage VDD1 reaches the first intermediate node 315, then the first P-type region 552 will sit at the first supply voltage VDD1 and the N-type region 554 will sit at the ground potential VSS1. Thus, PN-junction diode 590 will be forward biased. However, the pair of series connected switches 531-532 (e.g., the pair of series connected pass gate transistors) is adapted to prevent this state from occurring and, thereby, to prevent forward biasing of PN-junction diode 590, when the voltage level shifter circuit 500 receives the first supply voltage VDD1 from the first power supply 501 and the second supply voltage VDD2 from the second power supply 502 at different times. As mentioned above, only when the first supply voltage VDD1 from the first power supply 501 reaches the first switch 531 and the second supply voltage VDD2 from the second power supply 502 reaches the second switch 532 will the first signal 504 pass to the first intermediate node 515 and, thereby, to the voltage adjusting circuit 510. This ensures that the PFET 550 will already have been turned ON by the second supply voltage VDD2, when the first signal 504 at VDD1 reaches its drain region 552. Thus, the PN-junction diode 590 will not be forward biased.

The voltage adjusting circuit 510 is adapted to pull the first signal 504 at the first intermediate node 515 from the first supply voltage VDD1 to the second supply voltage VDD2. The buffer circuit 520 can also be connected to the pair of series connected switches 531-532 at the first intermediate node 515. This buffer circuit 520 can be adapted to generate, from the first signal 504 at the first intermediate node 515, the second signal 507 and to pass that second signal 507 to the output terminal 506. Again, the second signal 507 is representative of the first signal 504, but generated using the second supply voltage VDD2 so that it can be processed by a second device 508 operating in the second voltage domain.

It is anticipated that the above-described pair of series connected switches (e.g., pair of series connected pass gate transistors) can be incorporated into any known voltage level shifter circuit in order to prevent the formation forward biased PN-junction diodes during asynchronous powering-up of different power supplies. For example, a pair of series connected switches (e.g., pass gate transistors) can be incorporated in the voltage level shifter circuit illustrated in FIGS. 1-4 and described in detail above.

Figure 7:
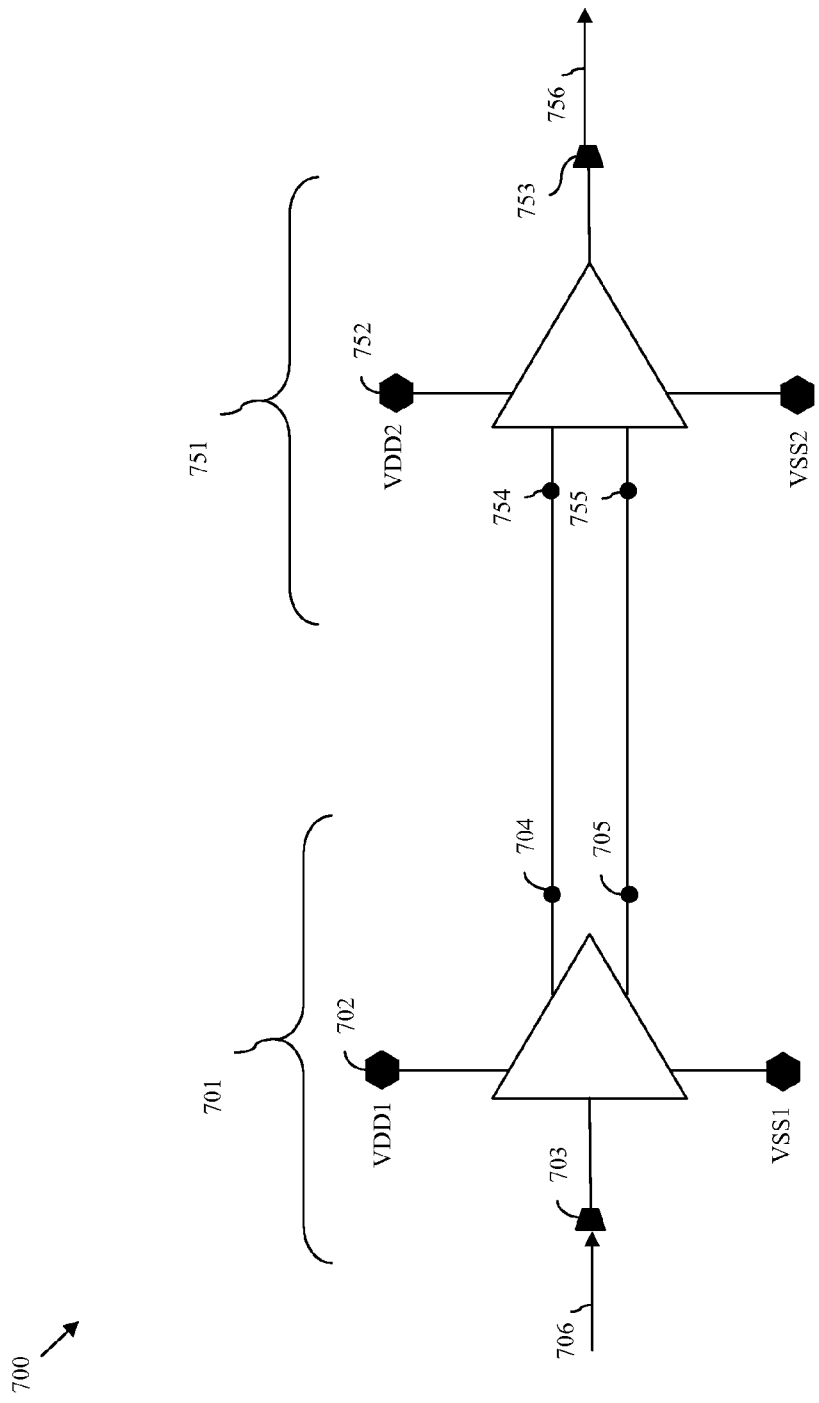
FIG. 7 is a schematic diagram illustrating an embodiment of a high speed voltage level shifter circuit according to the present invention.

Specifically, referring to FIG. 7, one particular embodiment of a voltage level shifter circuit according to the present invention can comprise a high speed voltage level shifter circuit 700. This voltage level shifter circuit 700 can be configured in much the same manner as the voltage level shifter circuit 100, illustrated in FIG. 1 and described in detail above. That is, the voltage level shifter circuit 700 can be composed of a first section 701 (see FIG. 8) and second section 751 (see FIG. 9).

The first section 701 can be connected to a first power supply 702 in order to receive a first supply voltage VDD1. Thus, the first section 701 operates in a first voltage domain. The first section 701 can comprise a first input terminal 703 adapted to receive a first signal 706 from a first device (not shown) operating in the same first voltage domain. That is, this first signal 706 is generated using the same first supply voltage VDD1. The first section 701 can also comprise two output terminals (i.e., a first section-first output terminal 704 and a first section-second output terminal 705).

The second section 751 can be connected to a second power supply 752 adapted to receive a second supply voltage VDD2 that is different from the first supply voltage VDD1. Thus, the second section 751 operates in a second voltage domain. The second section 751 can comprise two input terminals (i.e., a second section-first input terminal 754 and a second section-second input terminal 755) directly coupled to the two first section output terminals 704-705, respectively. The second section 751 can also comprise an output terminal (i.e., a second section-output terminal 753) adapted to output a second signal 756 (i.e., a converted signal) to a second device (not shown) operating in the same second voltage domain. That is, the second signal 756 is representative of the first signal 706, but is generated using the second supply voltage VDD2 so that it can be processed by a second device that also operates using the same second supply voltage VDD2.

Figure 8:
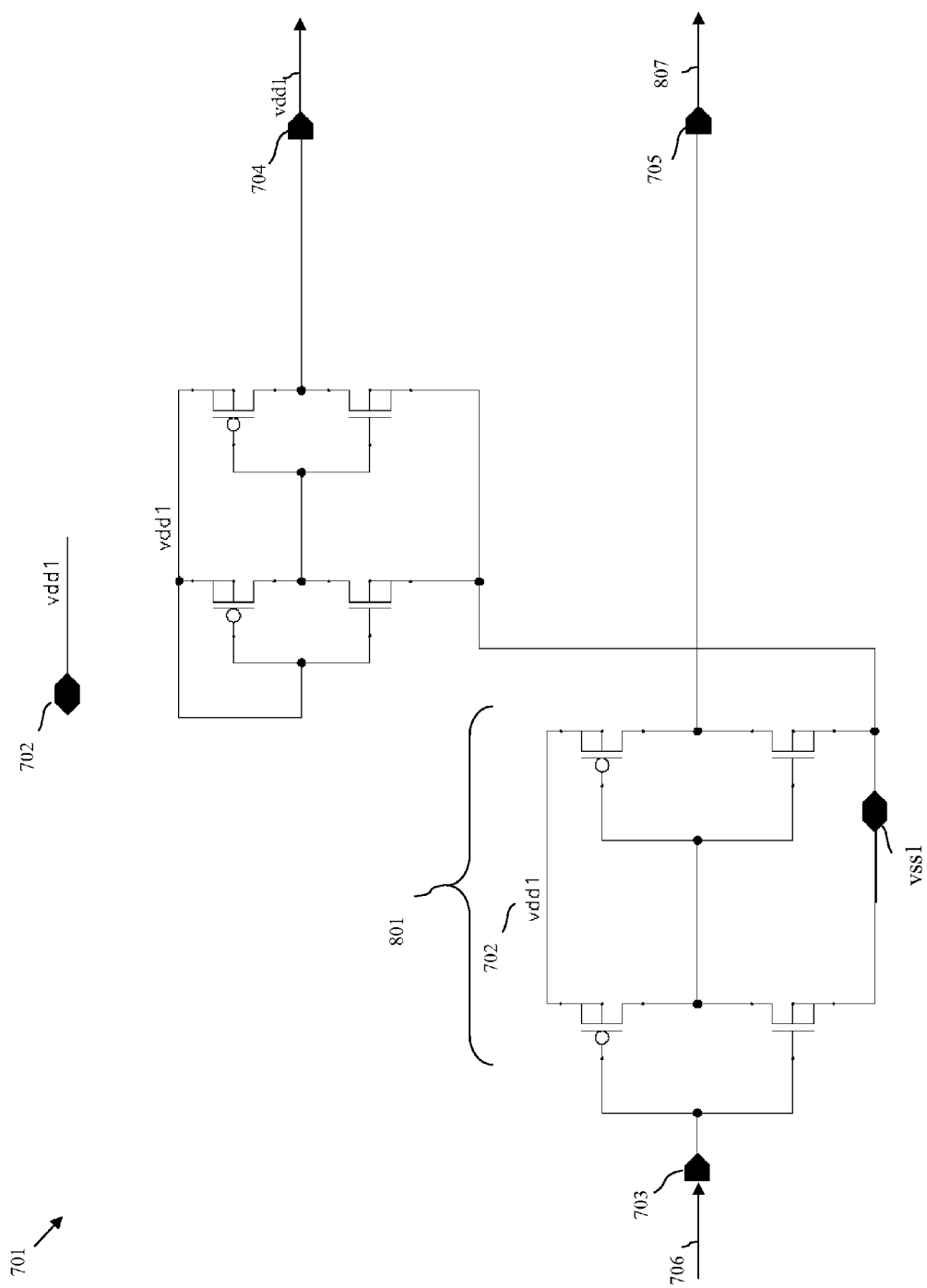
FIG. 8 is a schematic diagram illustrating a first section of the circuit of FIG. 7.

FIG. 8 is a detailed schematic diagram of the first section 701 of the voltage level shifter circuit 700 of FIG. 7. This first section 701 can be configured in the exact same manner the first section 101 of circuit 100 illustrated in FIG. 2. For example, the first section 701 can be connected to a first power supply 702 adapted to receive a first supply voltage VDD1. The first section 701 can comprise an input terminal 703 and two output terminals (i.e., a first section-first output terminal 704 and a first section-second output terminal 705). The first section-input terminal 703 can be adapted to receive a first signal 706 from a first device (not shown) that operates in the first voltage domain. That is, this first signal 706 is generated using the same first supply voltage VDD1, as supplied by the first power supply 701. The first signal 706 can be driven through a first section-buffer circuit 801, which is adapted to buffer the first signal 706 creating a buffered first signal 807 that is representative of the first signal 706. The first section-second output terminal 705 can be connected to the first section-buffer circuit 801, adapted to output the buffered first signal 807. The first section-first output terminal 704 is always maintained at logic high and, thus, generates the full rail voltage VDD1 from the first power supply 702.

Figure 9:
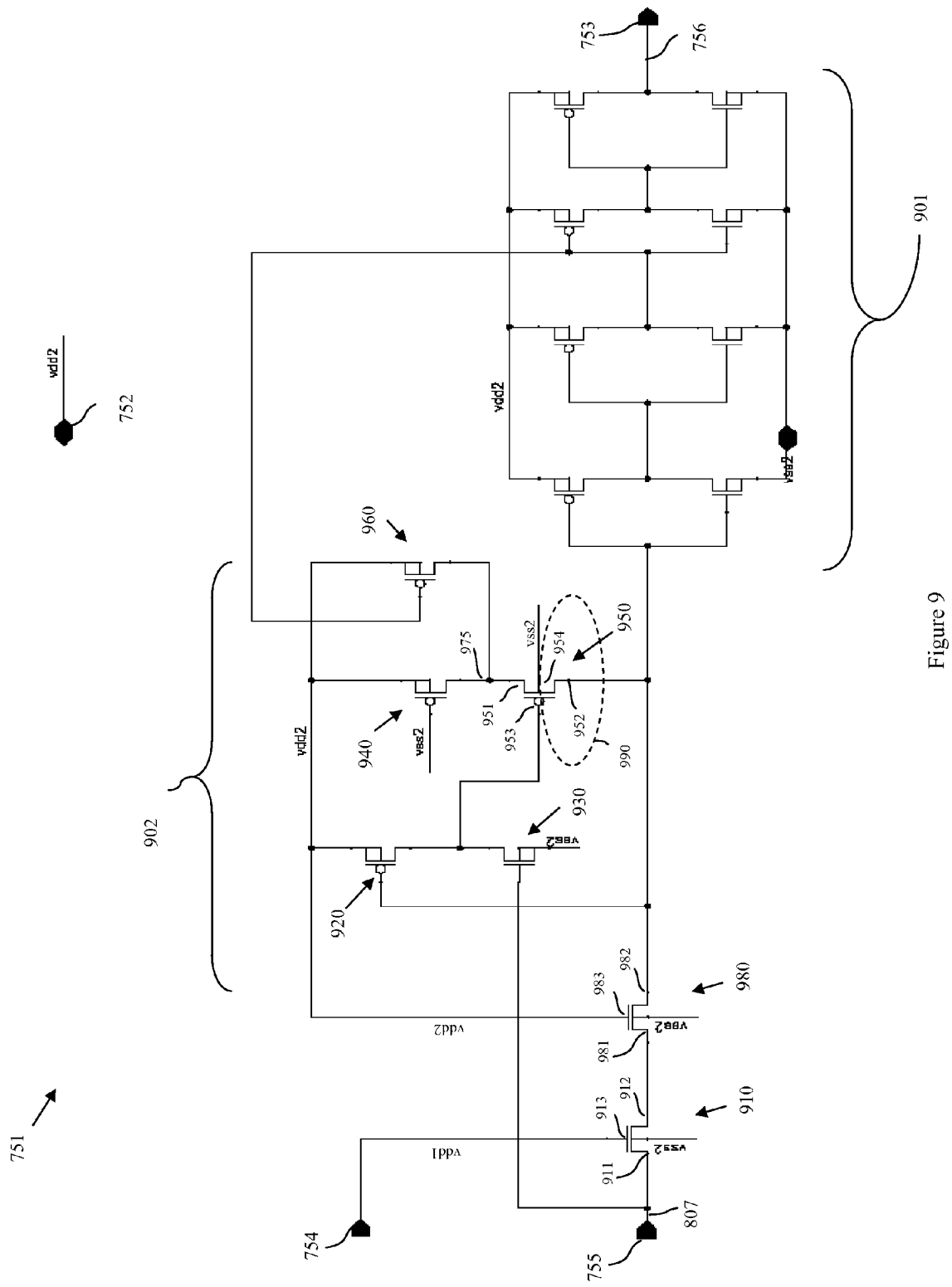
FIG. 9 is a schematic diagram illustrating a second section of the circuit of FIG. 7.

FIG. 9 is a detailed schematic diagram of the second section 751 of the voltage level circuit 700 of FIG. 7. This second section 751 can be configured in much the same manner as the second section 151 of circuit 100, illustrated in FIG. 3, in that it can comprise two input terminals 754-755, an output terminal 753, a voltage adjusting circuit 902 and a buffer circuit 901. However, contrary to the second section 151 of FIG. 3, the second section 751 of FIG. 9 incorporates a pair of series connected pass gate transistors 710 and 780, as opposed to a single pass gate transistor (see pass gate transistor 310 of FIG. 3), and each pass gate transistor 710, 780 in the series is controlled by a different supply voltage.

More specifically, the second section 751 can be connected to a second power supply 752 adapted to receive a second supply voltage VDD2 that is different from the first supply voltage VDD1. The second section 751 can comprise two input terminals (i.e., second section-first input terminal 754 and second section-second input terminal 755). The second section-second input terminal 755 can be directly coupled to the first section-second output terminal 705. Thus, the second section-second input terminal 755 can receive the buffered first signal 807. The second section-first input terminal 754 can be directly coupled to the first section-first output terminal 704. Thus, the second section-first input terminal 754 receives the full rail voltage VDD1 from the first power supply 702 output at the first section-first output terminal 704.

A unique aspect of this second section 751 is the incorporation of the pair of series connected pass gate transistors 910, 980 (e.g., series connected N-type field effect transistors (NFETs)). These pass gate transistors 910, 980 can be connected between the two second section input terminals 754, 755 and the voltage adjusting circuit 902. The first pass gate transistor 910 can comprise a first gate 913, a first source 911 and a first drain 912. In this first pass gate transistor 910, the first gate 913 can be controlled by the first supply voltage VDD1 at the second section-first input terminal 754 and the first source 912 can be connected to the second section-second input terminal 755. The second pass gate transistor 980 can be connected in series with the first pass gate transistor 910. Specifically, the second pass gate transistor 980 can comprise a second gate 983, a second source 981 and a second drain 7982. In the second pass gate transistor 980, the second gate 983 can be controlled by the second supply voltage VDD2 from the second power supply 752 and the second source 951 can be connected to the first drain 912 of the first pass gate transistor 910. Thus, only when the first supply voltage VDD1 reaches the first gate 913 of the first pass gate transistor 910 and the second supply voltage VDD2 reaches the second gate 983 of the second pass gate transistor 980 will the buffered first signal 807 pass through both the first pass gate transistor 910 and the second pass gate transistor 980 into the second drain 982 of the second pass gate transistor 980.

During asynchronous powering-up of the first power supply 701 and the second power supply 702, the pair of series connected pass gate transistors 710, 780 prevents forward biased PN-junction diode formation in the voltage adjusting circuit 902 so as to minimize leakage current from the first power supply 701 and the second power supply 702. For example, the second section 751 of the voltage level shifter circuit 700 can comprise a first intermediate node 915 adapted to connect the second section-input terminal 755 via the pair of series connected pass gate transistors 710, 780 to the voltage adjusting circuit 902. The voltage adjusting circuit 902 can comprise a conventional voltage adjusting circuit with plurality of interconnected N-type and P-type field effect transistors (e.g., PFET 920, NFET 930, PFET 940, PFET 950 and PFET 960). More particularly, the voltage adjusting circuit 902 can comprise at least one P-type field effect transistor (PFET) 950 having a first P-type region 952 (e.g., a P+ diffusion drain region) and a second P-type region 951 (e.g., a P+ diffusion source region). The first and second P-type regions 951-952 can be adjacent an N-type region 954 (e.g., within an NWELL in a P-substrate). The first P-type region 952 can be coupled to the first power supply 701 via the first intermediate node 915, the second P-type region 951 can be coupled to the second power supply 752 via a second intermediate node 975 and the N-type region 954 can be coupled to ground potential VSS2.

Consequently, if the PFET 950 is not turned ON (i.e., by the second power supply) at the same time or before the first supply voltage VDD1 reaches the first intermediate node, then the first P-type region 952 will sit at the first supply voltage VDD1 and the N-type region 954 will sit at the ground potential VSS2. Thus, the PN-junction diode 990 between the first P-type region 952 and the N-type region 954 will be forward biased. However, the pair of series connected pass gate transistors 910, 980 is adapted to prevent this state from occurring and thereby to prevent forward biasing of the PN-junction diode 990 (i.e., preventing forward biased PN-junction diode formation), when the voltage level shifter circuit 700 receives the first supply voltage VDD1 at the first gate 913 from the first power supply 702 and the second supply voltage VDD2 at the second gate 983 from the second power supply 752 at different times. As mentioned above, only when the first supply voltage VDD1 from the first power supply 702 reaches the first gate 913 and the second supply voltage VDD2 from the second power supply 752 reaches the second gate 783 will the buffered first signal 807 pass to the first intermediate node 915 and, thereby, to the voltage adjusting circuit 902. This ensures that the PFET 950 will already have been turned ON by the second supply voltage VDD2, when the buffered first signal 807 at VDD1 reaches its drain region 952. Thus, the PN-junction diode 990 will not be forward biased.

Once the buffered first signal 807 passes to the first intermediate node 915, the voltage adjusting circuit 902 is adapted to pull the buffered first signal 807 from the first supply voltage VDD1 to the second supply voltage VDD2. The second section-buffer circuit 901 can also be connected to the pair of series connected pass gate transistors 910, 980 at the first intermediate node 915. This second-section buffer circuit 901 (e.g., a four-stage buffer circuit) can be adapted to generate, from the buffered first signal 807 at the first intermediate node 915, the second signal 756 and to pass that second signal 756 to the second section-output terminal 753. Again, the second signal 756 is representative of the first signal 704, but generated using the second supply voltage VDD2 so that it can be processed by a second device (not shown) operating in the second voltage domain.

Figure 10:
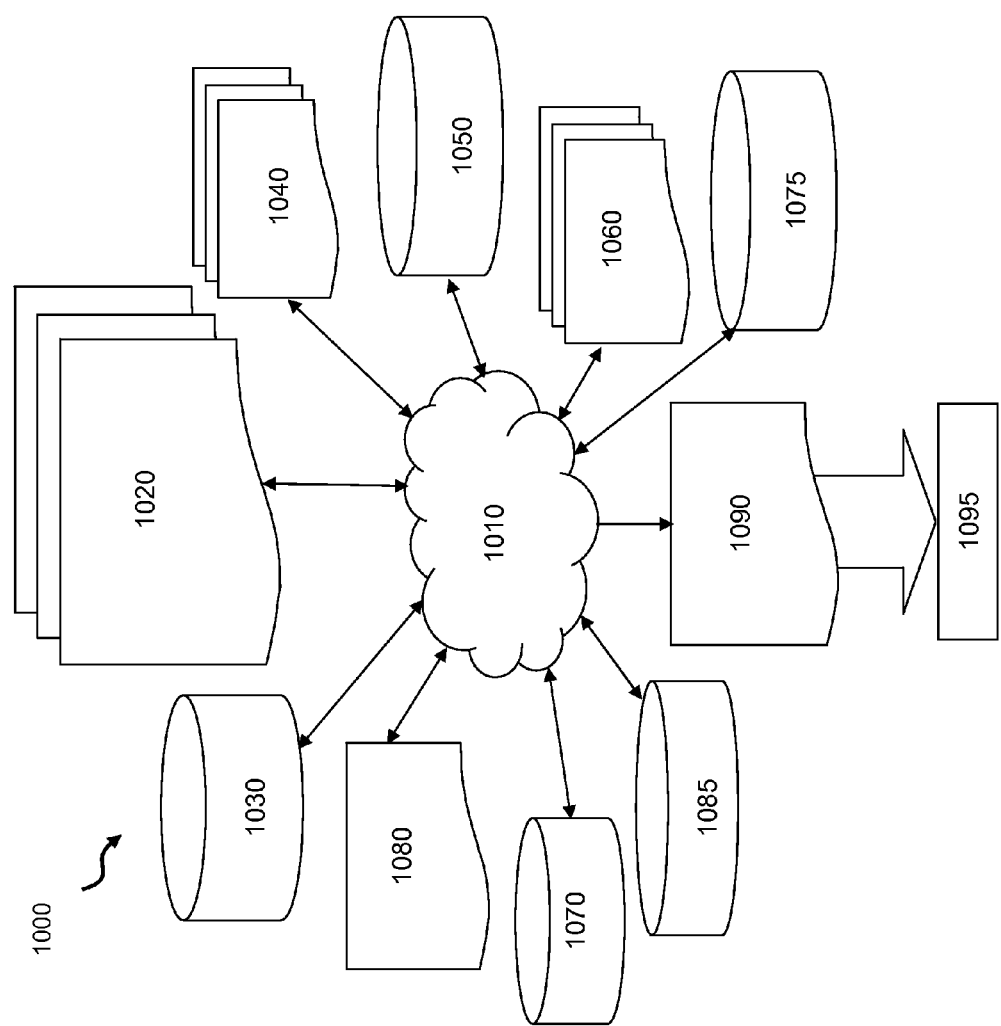
FIG. 10 is a block diagram illustrating an exemplary design flow process that can be used for designing the circuit embodiments of the present invention.

Also disclosed are embodiments of a design structure embodied in machine readable medium used in a design flow process, where the design structure represent any one or more of the voltage level shifter circuit embodiments, discussed in detail above and illustrated in FIGS. 5-9. More specifically, FIG. 10 shows a block diagram of an example design flow 1000. Design flow 1000 may vary depending on the type of IC being designed. For example, a design flow 1000 for building an application specific IC (ASIC) will differ from a design flow 1000 for designing a standard component. Design structure 1020 is an input to a design process 1010 and may come from an IP provider, a core developer, or other design company. Design structure 1020 comprises the voltage level shifter circuit embodiments disclosed herein in the form of schematics or HDL, a hardware-description language, (e.g., Verilog, VHDL, C, etc.). Design structure 1020 may be stored on one or more machine readable mediums 1075 as shown in FIG. 10. For example, design structure 1020 may be a text file or a graphical representation of any one or more of the voltage level shifter circuit embodiments disclosed herein. Design process 1010 synthesizes (or translates) the one or more voltage level shifter circuit embodiments disclosed herein into a netlist 1080, where netlist 1080 is, for example, a list of fat wires, transistors, logic gates, control circuits, I/O, models, etc. and describes the connections to other elements and circuits in an integrated circuit design and recorded on at least one of machine readable medium 1075.

Design process 1010 includes using a variety of inputs; for example, inputs from library elements 1030 which may house a set of commonly used elements, circuits, and devices, including models, layouts, and symbolic representations, for a given manufacturing technology (e.g. different technology nodes, 32 nm, 45 nm, 90 nm, etc.), design specifications 1040, characterization data 1050, verification data 1060, design rules 1070, and test data files 1085, which may include test patterns and other testing information. Design process 1010 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1010 without deviating from the scope and spirit of the invention.

Ultimately design process 1010 translates the one or more voltage level shifter circuit embodiments, along with the rest of the integrated circuit design (if applicable), into a final design structure 1090 (e.g., information stored in a GDS storage medium 1075). Final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100 or any of the other circuit embodiments disclosed herein. Final design structure 1090 may then proceed to a stage 1095 of design flow 1000; where stage 1095 is, for example, where final design structure 1090: proceeds to tape-out, is released to manufacturing, is sent to another design house or is sent back to the customer.

Figure 11:
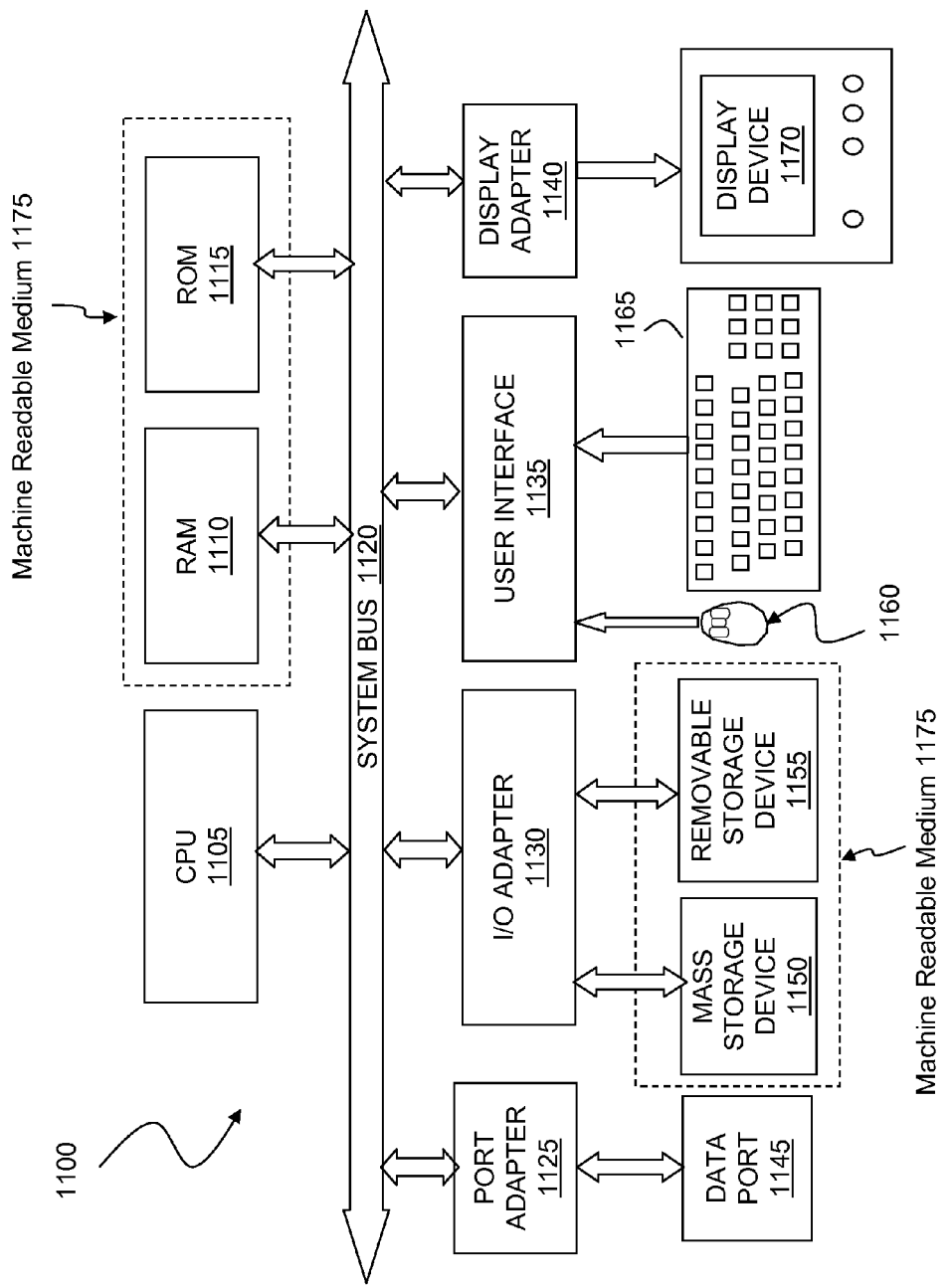
FIG. 11 is a block diagram illustrating an exemplary computer system that can be used to implement the circuit and circuit design structure embodiments of the present invention.

FIG. 11 is a schematic block diagram of a general-purpose computer system 1100 for practicing the design process, discussed above. The computer system 1100 has at least one microprocessor or central processing unit (CPU) 1105. CPU 1105 is interconnected via a system bus 1120 to machine readable media 1175, which includes, for example, a random access memory (RAM) 1110, a read-only memory (ROM) 1115, a removable and/or program storage device 1155 and a mass data and/or program storage device 1150. An input/output (I/O) adapter 1130 connects mass storage device 1150 and removable storage device 1155 to system bus 1120. A user interface 1135 connects a keyboard 1165 and a mouse 1160 to system bus 1120, and a port adapter 1125 connects a data port 1145 to system bus 1120 and a display adapter 1140 connect a display device 1170. ROM 1115 contains the basic operating system for computer system 1100. Examples of removable data and/or program storage device 1155 include magnetic media such as floppy drives, tape drives, portable flash drives, zip drives, and optical media such as CD ROM or DVD drives. Examples of mass data and/or program storage device 1150 include hard disk drives and non-volatile memory such as flash memory. In addition to keyboard 1165 and mouse 1160, other user input devices such as trackballs, writing tablets, pressure pads, microphones, light pens and position-sensing screen displays may be connected to user interface 1135. Examples of display device 1170 include cathode-ray tubes (CRT) and liquid crystal displays (LCD).

A machine readable computer program may be created by one of skill in the art and stored in computer system 1100 and/or any one or more of machine readable medium 1175 to simplify the practicing of this invention. That is, the design structure 1090 of FIG. 10 may be embodied in a machine readable medium 1175 and this machine readable medium 1175 may be used in the design process 1010 of FIG. 10, where the design structure 1090 represents any one or more of the voltage level shifter circuit embodiments illustrated in FIGS. 5-9. In operation, information for the computer program created to run the present invention is loaded on the appropriate removable data and/or program storage device 1155, fed through data port 1145 or entered using keyboard 1165. A user controls the program by manipulating functions performed by the computer program and providing other data inputs via any of the above mentioned data input means. Display device 1170 provides a means for the user to accurately control the computer program and perform the desired tasks described herein.

In view of the foregoing, disclosed here are embodiments of a high speed voltage level shifter circuit capable of operating (i.e., capable of translating voltage levels amongst multiple voltage domains) without the formation of any forward biased PN-junction diodes, regardless of the sequence in which different power supplies are powered up (i.e., regardless of the sequence in which different supply voltages are received by the circuit). Specifically, the circuit embodiments incorporate a pair of series connected switches (e.g., series connected pass gate transistors) between an input terminal and a voltage adjusting circuit. Each switch is controlled by a different supply voltage from a different power supply. Thus, only when both power supplies are powered-up and the different supply voltages are received at both switches will a first signal generated using one of the supply voltages be passed to a voltage adjusting circuit and thereafter converted into a second signal representative of the first signal, but generated using the second supply voltage VDD2. Incorporation of the pair of series connected switches into the voltage level shifter circuit prevents forward biasing of PN-junction diodes in the circuit and thereby prevents current leakage from the power supplies.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A voltage level shifter circuit comprising:
a first power supply adapted to provide a first supply voltage;
a second power supply adapted to provide a second supply voltage different from said first supply voltage;
an input terminal adapted to receive a first signal generated using said first supply voltage;
an output terminal adapted to output a second signal representative of said first signal and generated using said second supply voltage;
a voltage adjusting circuit connected between said input terminal and said output terminal and adapted to pull said first signal from said first supply voltage to said second supply voltage; and
a pair of series connected switches connected between said input terminal and said voltage adjusting circuit, wherein said pair comprises a first switch controlled by said first power supply and a second switch controlled by said second power supply such that only when said first supply voltage from said first power supply reaches said first switch and said second supply voltage from said second power supply reaches said second switch will said first signal pass to said voltage adjusting circuit, wherein, during asynchronous powering-up of said first power supply and said second power supply, said pair of series connected switches prevents forward biased PN-junction diode formation in said voltage adjusting circuit so as to minimize leakage current from said first power supply and said second power supply.

2. A voltage level shifter circuit comprising:
a first power supply adapted to provide a first supply voltage;
a second power supply adapted to provide a second supply voltage different from said first supply voltage;
an input terminal adapted to receive a first signal generated using said first supply voltage;
an output terminal adapted to output a second signal representative of said first signal and generated using said second supply voltage;
a voltage adjusting circuit connected between said input terminal and said output terminal and adapted to pull said first signal from said first supply voltage to said second supply voltage;
a pair of series connected switches connected between said input terminal and said voltage adjusting circuit, wherein said pair comprises a first switch controlled by said first power supply and a second switch controlled by said second power supply such that only when said first supply voltage from said first power supply reaches said first switch and said second supply voltage from said second power supply reaches said second switch will said first signal pass to said voltage adjusting circuit; and
first intermediate node adapted to connect said input terminal via said pair of series connected switches to said voltage adjusting circuit,
wherein said voltage adjusting circuit comprises at least one P-type field effect transistor (PFET) having, adjacent an N-type region, a first P-type region and a second P-type region, and
wherein said first P-type region is coupled to said first power supply via said first intermediate node, said second P-type region is coupled to said second power supply via a second intermediate node and said N-type region is coupled to ground potential.

3. The voltage level shifter circuit of claim 2, wherein said pair of series connected switches is adapted to prevent said first P-type region from sitting at said first supply voltage and said N-type region from sitting at said ground potential and thereby to prevent said forward biased PN-junction diode formation, when said voltage level shifter circuit receives said first supply voltage from said first power supply and said second supply voltage from said second power supply at different times.

4. The voltage level shifter circuit of claim 2, further comprising a buffer circuit connected to said pair of series connected switches at said first intermediate node, wherein said buffer circuit is adapted to generate, from said first signal at said intermediate node, said second signal and to pass said second signal to said output terminal.

5. A voltage level shifter circuit comprising:
a first power supply adapted to provide a first supply voltage;
a second power supply adapted to provide a second supply voltage different from said first supply voltage;
an input terminal adapted to receive a first signal generated using said first supply voltage;
an output terminal adapted to output a second signal representative of said first signal and generated using said second supply voltage;

a voltage adjusting circuit connected between said input terminal and said output terminal and adapted to pull said first signal from said first supply voltage to said second supply voltage; and a pair of series connected pass gate transistors connected between said input terminal and said voltage adjusting circuit, wherein said pair comprises a first pass gate transistor with a first gate controlled by said first power supply and a second pass gate transistor with a second gate controlled by said second power supply such that only when said first supply voltage from said first power supply reaches said first gate and said second supply voltage from said second power supply reaches said second gate will said first signal pass through said first pass gate transistor and said second pass gate transistor to said voltage adjusting circuit, wherein, during asynchronous powering-up of said first power supply and said second power supply, said pair of series connected pass gate transistors prevents forward biased PN-junction diode formation in said voltage adjusting circuit so as to minimize leakage current from said first power supply and said second power supply.

6. The voltage level shifter circuit of 5, wherein said first pass gate transistor and said second pass gate transistor each comprise N-type field effect transistors (NFETs).

7. A voltage level shifter circuit comprising:
a first power supply adapted to provide a first supply voltage;
a second power supply adapted to provide a second supply voltage different from said first supply voltage;
an input terminal adapted to receive a first signal generated using said first supply voltage;
an output terminal adapted to output a second signal representative of said first signal and generated using said second supply voltage;
a voltage adjusting circuit connected between said input terminal and said output terminal and adapted to pull said first signal from said first supply voltage to said second supply voltage;
a pair of series connected pass gate transistors connected between said input terminal and said voltage adjusting circuit, wherein said pair comprises a first pass gate transistor with a first gate controlled by said first power supply and a second pass gate transistor with a second gate controlled by said second power supply such that only when said first supply voltage from said first power supply reaches said first gate and said second supply voltage from said second power supply reaches said second gate will said first signal pass through said first pass gate transistor and said second pass gate transistor to said voltage adjusting circuit; and
first intermediate node adapted to connect said input terminal via said pair of series connected pass gate transistors to said voltage adjusting circuit,
wherein said voltage adjusting circuit comprises at least one P-type field effect transistor (PFET) having, adjacent an N-type region, a first P-type region and a second P-type region, and
wherein said first P-type region is coupled to said first power supply via said first intermediate node, said second P-type region is coupled to said second power supply via a second intermediate node and said N-type region is coupled to ground potential.

8. The voltage level shifter circuit of claim 7, wherein said pair of series connected pass gate transistors is adapted to prevent said first P-type region from sitting at said first supply voltage and said N-type region from sitting at said ground potential and thereby to prevent said forward biased PN-junction diode formation, when said voltage level shifter circuit receives said first supply voltage from said first power supply and said second supply voltage from said second power supply at different times.

9. The voltage level shifter circuit of claim 7, further comprising a buffer circuit connected to said pair of series connected pass gate transistors at said first intermediate node, wherein said buffer circuit is adapted to generate, from said first signal at said first intermediate node, said second signal and to pass said second signal to said output terminal.

10. A voltage level shifter circuit comprising:
a first power supply adapted to provide a first supply voltage;
a second power supply adapted to provide a second supply voltage different from said first supply voltage;
a first section comprising:
a first section-input terminal adapted to receive a first signal generated using said first supply voltage;
a first section-first output terminal adapted to output said first supply voltage; and
a first section-second output terminal adapted to output a buffered first signal representative of said first signal; and
a second section comprising:
a second section-first input terminal adapted to receive said first supply voltage from said first section-first output terminal;
a second section-second input terminal adapted to receive said buffered first signal from said first section-second output terminal;
a second section-output terminal adapted to output a second signal representative of said first signal and generated using said second supply voltage;
a first pass gate transistor comprising a first gate, a first source and a first drain, wherein said first gate is controlled by said first supply voltage at said second section-first input terminal and wherein said first source is connected to said second section-second input terminal; and
a second pass gate transistor connected in series with said first pass gate transistor and comprising a second gate, a second source and a second drain, wherein said second gate is controlled by said second supply voltage from said second power supply and said second source is connected to said first drain of said first pass gate transistor such that only when said first supply voltage reaches said first gate and said second supply voltage reaches said second gate will said first signal pass through both said first pass gate transistor and said second pass gate transistor into said second drain of said second pass gate transistor; and
a voltage adjusting circuit connected between said second drain of said second pass gate transistor and said second output terminal, wherein said voltage adjusting circuit is adapted to pull said buffered first signal from said first supply voltage to said second supply voltage,
wherein, during asynchronous powering-up of said first power supply and said second power supply, said first pass gate transistor and said second pass gate transistor prevent forward biased PN-junction diode formation in said voltage adjusting circuit in order to minimize leakage current from said first power supply and said second power supply.

11. A voltage level shifter circuit of 10, wherein said first pass gate transistor comprises a first N-type field effect transistor (first NFET) and said second pass gate transistor comprises a second N-type field effect transistor (second NFET).

12. A voltage level shifter circuit comprising:
a first power supply adapted to provide a first supply voltage;
a second power supply adapted to provide a second supply voltage different from said first supply voltage;
a first section comprising:
a first section-input terminal adapted to receive a first signal generated using said first supply voltage;
a first section-first output terminal adapted to output said first supply voltage; and
a first section-second output terminal adapted to output a buffered first signal representative of said first signal; and
a second section comprising:
a second section-first input terminal adapted to receive said first supply voltage from said first section-first output terminal;
a second section-second input terminal adapted to receive said buffered first signal from said first section-second output terminal;
a second section-output terminal adapted to output a second signal representative of said first signal and generated using said second supply voltage;
a first pass gate transistor comprising a first gate, a first source and a first drain, wherein said first gate is controlled by said first supply voltage at said second section-first input terminal and wherein said first source is connected to said second section-second input terminal; and
a second pass gate transistor connected in series with said first pass gate transistor and comprising a second gate, a second source and a second drain, wherein said second gate is controlled by said second supply voltage from said second power supply and said second source is connected to said first drain of said first pass gate transistor such that only when said first supply voltage reaches said first gate and said second supply voltage reaches said second gate will said first signal pass through both said first pass gate transistor and said second pass gate transistor into said second drain of said second pass gate transistor;
a voltage adjusting circuit connected between said second drain of said second pass gate transistor and said second output terminal, wherein said voltage adjusting circuit is adapted to pull said buffered first signal from said first supply voltage to said second supply voltage; and
first intermediate node adapted to connect said input terminal via said first pass gate transistor and said second pass gate transistor to said voltage adjusting circuit,
wherein said voltage adjusting circuit comprises at least one P-type field effect transistor (PFET) having, adjacent a N-type region, a first P-type region and a second P-type region, and
wherein said first P-type region is coupled to said first power supply via said first intermediate node, said second P-type region is coupled to said second power supply via a second intermediate node and said N-type region is coupled to ground potential.

13. The voltage level shifter circuit of claim 12, wherein first pass gate transistor and said second pass gate transistor are adapted to prevent said first P-type region from sitting at said first supply voltage and said N-type from sitting at said ground potential and thereby to prevent said forward biased PN-junction diode formation, when said first supply voltage reaches said first gate and said second supply voltage reaches said second gate at different times.

14. The voltage level shifter circuit of claim 12, further comprising a buffer circuit connected to said second drain at said first intermediate node, wherein said buffer circuit is adapted to generate, from said buffered first signal at said first intermediate node, said second signal and to pass said second signal to said second-section output terminal.

15. A design structure embodied in a machine readable medium using in a design flow process for designing a circuit, said circuit comprising:
a first power supply adapted to provide a first supply voltage;
a second power supply adapted to provide a second supply voltage different from said first supply voltage;
an input terminal adapted to receive a first signal generated using said first supply voltage;
an output terminal adapted to output a second signal representative of said first signal and generated using said second supply voltage;
a voltage adjusting circuit connected between said input terminal and said output terminal and adapted to pull said first signal from said first supply voltage to said second supply voltage; and
a pair of series connected switches connected between said input terminal and said voltage adjusting circuit, wherein said pair comprises a first switch controlled by said first power supply and a second switch controlled by said second power supply such that only when said first supply voltage from said first power supply reaches said first switch and said second supply voltage from said second power supply reaches said second switch will said first signal pass to said voltage adjusting circuit,
wherein, during asynchronous powering-up of said first power supply and said second power supply, said pair of series connected switches prevents forward biased PN-junction diode formation in said voltage adjusting circuit so as to minimize leakage current from said first power supply and said second power supply.

16. The design structure of claim 15, wherein said design structure comprises a netlist which describes said circuit.

17. The design structure of claim 15, wherein said design structure resides on a GDS storage medium.

* * * * *